(12) United States Patent
Tanaka et al.

(10) Patent No.: US 6,501,191 B2
(45) Date of Patent: Dec. 31, 2002

(54) HEAT TREATMENT APPARATUS AND METHOD

(75) Inventors: Takashi Tanaka, Kikuchi-gun (JP); Shinji Nagashima, Kikuchi-gun (JP); Hiroyuki Sakai, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/989,080

(22) Filed: Nov. 21, 2001

(65) Prior Publication Data

US 2002/0063119 A1 May 30, 2002

(30) Foreign Application Priority Data

Nov. 27, 2000 (JP) .................................... 2000-360293

(51) Int. Cl.[7] .............................................. C23C 16/00
(52) U.S. Cl. .................... 290/390; 219/405; 219/411; 118/724; 118/725; 392/416; 392/418
(58) Field of Search ................................ 219/390, 405, 219/411; 392/416, 418; 118/724, 725, 728, 50.1

(56) References Cited

U.S. PATENT DOCUMENTS

| | | | | |
|---|---|---|---|---|
| 5,016,563 A | * | 5/1991 | Murakami et al. ........... | 118/723 |
| 5,303,671 A | * | 4/1994 | Kondo et al. ................ | 118/719 |
| 5,365,772 A | * | 11/1994 | Ueda et al. .................. | 73/40.7 |
| 5,834,737 A | | 11/1998 | Hirose et al. | |
| 6,015,594 A | * | 1/2000 | Yoshikawa ................ | 427/398.1 |
| 6,350,316 B1 | * | 2/2000 | Hayashi et al. .............. | 118/52 |
| 6,190,459 B1 | | 2/2001 | Takeshita et al. | |
| 6,246,030 B1 | | 6/2001 | Matsumyama | |
| 6,248,168 B1 | | 6/2001 | Takeshita et al. | |

* cited by examiner

*Primary Examiner*—Teresa Walberg
*Assistant Examiner*—Shawntina T Fuqua
(74) *Attorney, Agent, or Firm*—Oblon, Spivak, McClelland, Maier & Neustadt, P.C.

(57) ABSTRACT

A heat treatment apparatus for applying a predetermined heat treatment to a substrate includes: for example, a dielectric low oxygen controlled cure unit (DLC unit) for forming an interlayer insulating film on a semiconductor wafer W; a hot plate for supporting the wafer W a predetermined distance apart from the surface thereof; a chamber for housing the wafer W; a gas collecting port formed in that portion of the hot plate which corresponds to the lower side of the wafer W when the wafer W is disposed on the hot plate; and an oxygen sensor for measuring the oxygen concentration in the gas collected from the gas collecting port. Since the oxygen concentration can be measured during the heat treatment to the wafer W, the characteristics of the interlayer insulating film formed can be maintained constant.

22 Claims, 11 Drawing Sheets

HEAT TREATMENT APPARATUS AND METHOD

BACKGROUND OF THE INVENTION

1. Field of the Invention

The present invention relates to a heat treatment apparatus and method for forming a film such as an interlayer insulating film on a substrate such as a semiconductor wafer.

2. Description of the Related Art

In the manufacturing process of a semiconductor device, a dielectric film such as an interlayer insulating film is formed by using an spin on dielectric (SOD) system. In the SOD system, a film is spin-coated on a semiconductor wafer by, for example, a sol-gel method, a silk method, a speed film method or a Fox method, followed by applying a chemical treatment, or a heat treatment to the coated film so as to form a desired film.

Where the interlayer insulating film is formed by the silk method, the speed film method or the FOX method, a semiconductor wafer maintained at a predetermined temperature is coated with a coating solution so as to form a coated film, followed by applying a heating treatment to the wafer and subsequently cooling again the wafer to a predetermined temperature. Further, a curing treatment, in which a heating treatment and a cooling treatment are applied under an atmosphere having a low oxygen concentration, is applied to the coated film so as to cure the coated film, thereby obtaining an interlayer insulating film.

If the oxygen concentration is increased during the curing treatment under the state that the wafer temperature is elevated, a disadvantage arises that the dielectric constant of the formed interlayer insulating film is increased. In order to solve the problem, the curing treatment is performed in practice by allowing an inert gas such as a nitrogen gas to flow into the chamber in which the wafer is disposed.

However, the curing treatment is not performed nowadays under the state that the oxygen concentration within the chamber is measured during the curing treatment for confirming whether or not the curing treatment is being performed under an atmosphere having an oxygen concentration not higher than a predetermined level. When the oxygen concentration during the curing treatment is higher than the predetermined level, disadvantages arise that the dielectric constant of the formed interlayer insulating film is increased, and that the formed interlayer insulating films are rendered nonuniform in the film quality every wafer.

BRIEF SUMMARY OF THE INVENTION

A first object of the present invention is to provide a heat treatment apparatus and a heat treatment method that permit confirming whether or not the heat treatment such as the curing treatment is being carried out under an atmosphere having an oxygen concentration not higher than a predetermined level. Further, a second object of the present invention is to provide a heat treatment apparatus that permits controlling the fluctuation in the oxygen concentration in performing the heat treatment.

According to a first aspect of the present invention, there is provided a heat treatment apparatus for applying a predetermined heat treatment to a substrate having a coated film formed thereon, comprising a hot plate on which the substrate is disposed; a chamber for housing the substrate disposed on said hot plate; and oxygen concentration measuring means for measuring the oxygen concentration within said chamber; wherein the oxygen concentration can be measured by said oxygen concentration measuring means while a heat treatment is being applied to said substrate.

According to a second aspect of the present invention, there is provided a heat treatment apparatus for applying a predetermined heat treatment to a substrate having a coated film formed thereon, comprising a hot plate capable of supporting a substrate a predetermined distance apart from the surface thereof; a chamber for housing the substrate supported by said hot plate; a gas collecting port for collecting the gas within the chamber, said gas collecting port being formed in said hot plate in a position facing the lower surface of the substrate when the substrate is disposed on the hot plate; and oxygen concentration measuring means for measuring the oxygen concentration in the gas collected from said gas collecting port; wherein the oxygen concentration can be measured by said oxygen gas measuring means while a heat treatment is being applied to the substrate.

According to a third aspect of the present invention, there is provided a heat treatment apparatus, which includes a heating process chamber and a cooling process chamber, for applying a predetermined heat treatment to a substrate having a coated film formed thereon, said heating process chamber comprising a hot plate capable of supporting a substrate a predetermined distance apart from the surface thereof; a chamber for housing the substrate supported by said hot plate; gas supply means for supplying an inert gas into said chamber; exhaust means for exhausting said chamber from an upper portion of the chamber; a first gas collecting port for collecting the gas from within said heating process chamber or from within the chamber, said first gas collecting port being formed in the hot plate in a position facing the lower surface of the substrate when the substrate is disposed on the hot plate; and first oxygen concentration measuring means for measuring the oxygen concentration in the gas collected from said first gas collecting port; and said cooling process chamber comprising a cooling plate capable of supporting the substrate a predetermined distance apart from the surface thereof; a second gas collecting port for collecting the gas from within said cooling process chamber, said second gas collecting port being formed in said cooling plate in a position facing the lower surface of the substrate when the substrate is disposed on said cooling plate; and second oxygen concentration measuring means for measuring the oxygen concentration in the gas collected from said second gas collecting port; wherein the oxygen concentration can be measured by said first oxygen concentration measuring means and said second oxygen concentration measuring means while a heat treatment is being applied to the substrate.

According to a fourth aspect of the present invention, there is provided a heat treatment method for applying a predetermined heat treatment to a substrate having a coated film formed thereon, comprising a first step of disposing a substrate on a thermal processing plate; a second step of collecting a predetermined gas from below the substrate disposed on said thermal processing plate for measuring the oxygen concentration of said predetermined gas; and a third step of holding said substrate for a predetermined time while measuring said oxygen concentration.

According to a fifth aspect of the present invention, there is provided a heat treatment method for applying a predetermined heat treatment to a substrate having a coated film formed thereon, comprising a first step of holding a substrate in a predetermined position above a thermal processing plate and supplying an inert gas toward said substrate; a second step of collecting for measuring the oxygen concentration in a predetermined gas said predetermined gas from a position on the upper surface of said thermal processing plate and below the lower surface of said substrate when the substrate is disposed on said thermal processing plate; a third step of disposing the substrate close to said thermal processing plate and holding the substrate for a predetermined time while measuring said oxygen concentration; and a fourth step of taking out the substrate held for the predetermined time on the thermal processing plate so as to stop the measurement of the oxygen concentration.

According to the heat treatment apparatus and method of the present invention, it is possible to apply a heat treatment while measuring the oxygen concentration in forming, for example, an interlayer insulating film, thereby preventing the quality of the interlayer insulating film from being changed by the oxidation caused by the fluctuation in the oxygen concentration, thereby maintaining constant the quality of the interlayer insulating film. It should also be noted that the substrate to which the heat treatment was not applied under a predetermined oxygen concentration is not transferred into the succeeding process steps so as to prevent a useless treatment from being applied to the particular substrate, thereby improving the productivity. Further, when an abnormality occurs in the oxygen concentration during the heat treatment, it is possible to interrupt the processing so as to prevent a processing error. Further, when it has become impossible to maintain a predetermined oxygen concentration in the processing atmosphere or when a periodic maintenance is executed, it is possible to confirm easily after completion of, for example, the maintenance operation whether or not the oxygen concentration within the chamber is lower than a predetermined level. It follows that the maintenance operation can be performed satisfactorily so as to improve the reliability of the heat treatment apparatus.

Further, according to a sixth aspect of the present invention, there is provided a heat treatment apparatus for applying a predetermined heat treatment to a substrate having a coated film formed thereon, comprising: a heat treatment chamber including a thermal processing plate capable of supporting a substrate a predetermined distance apart from the surface thereof and including a chamber for housing the substrate supported by said thermal processing plate; and an exhaust mechanism for exhausting said heating process chamber from a corner portion on the bottom side.

In the heat treatment apparatus of the particular structure, the heating process chamber is exhausted from a corner portion on the bottom side so as to discharge the gas that tends to be accumulated in the corner portion of the heating process chamber. Therefore, it is possible to maintain uniform the atmosphere within the heating process chamber so as to maintain constant the quality of the substrate.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

The heat treatment apparatus and method of the present invention will now be described in detail with reference to the accompanying drawings. Described in the following is a spin on dielectric (SOD) system including a dielectric low oxygen controlled cure (DLC) unit, wherein the oxygen concentration can be controlled to a low level and a curing treatment can be applied to the coated film formed on a substrate by applying a heating process and a cooling process to the substrate, and a dielectric low oxygen controlled bake (DLB) unit, wherein the oxygen concentration can be controlled to a low level and the coated film formed on the substrate can be subjected to a heat treatment by applying a heat treatment to the substrate.

Figure 1:
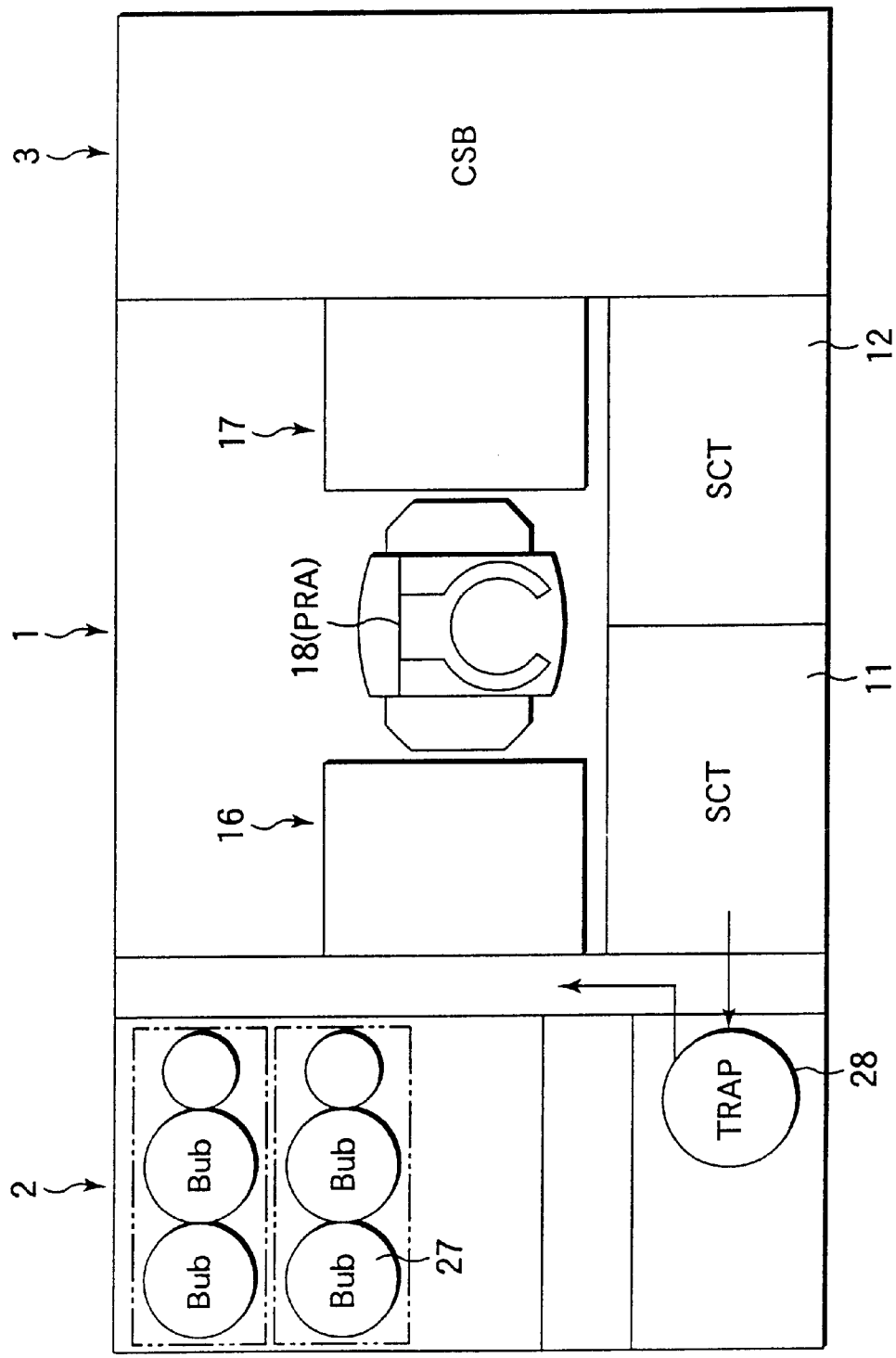
FIG. 1 is a plan view schematically showing the structure of a spin on dielectric (SOD) system including a dielectric low oxygen controlled cure (DLC) unit and a dielectric low oxygen controlled bake (DLB) unit according to one embodiment of the heat treatment apparatus of the present invention.
Figure 2:
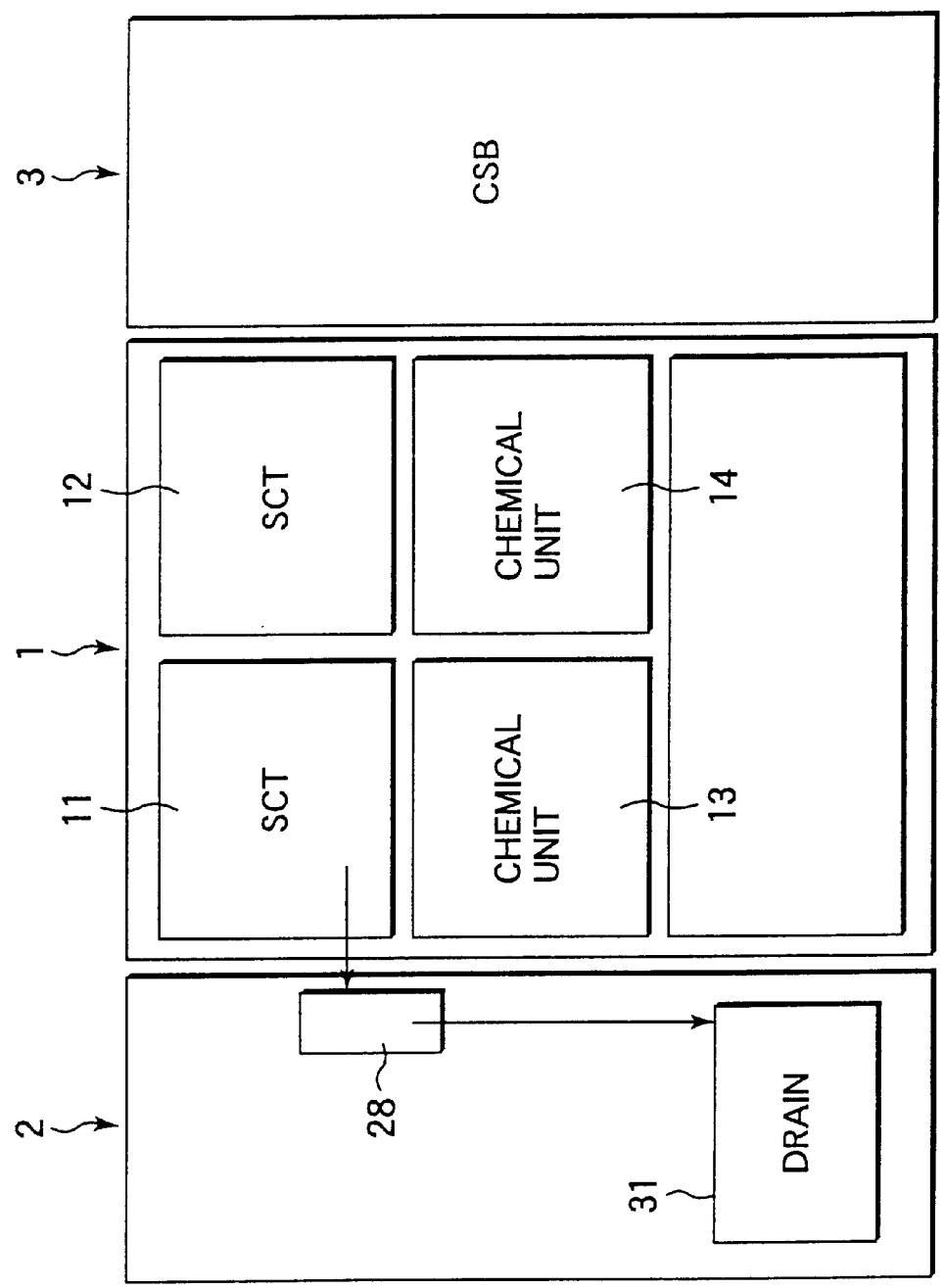
FIG. 2 is a side view schematically showing the structure of the SOD system shown in FIG. 1.
Figure 3:
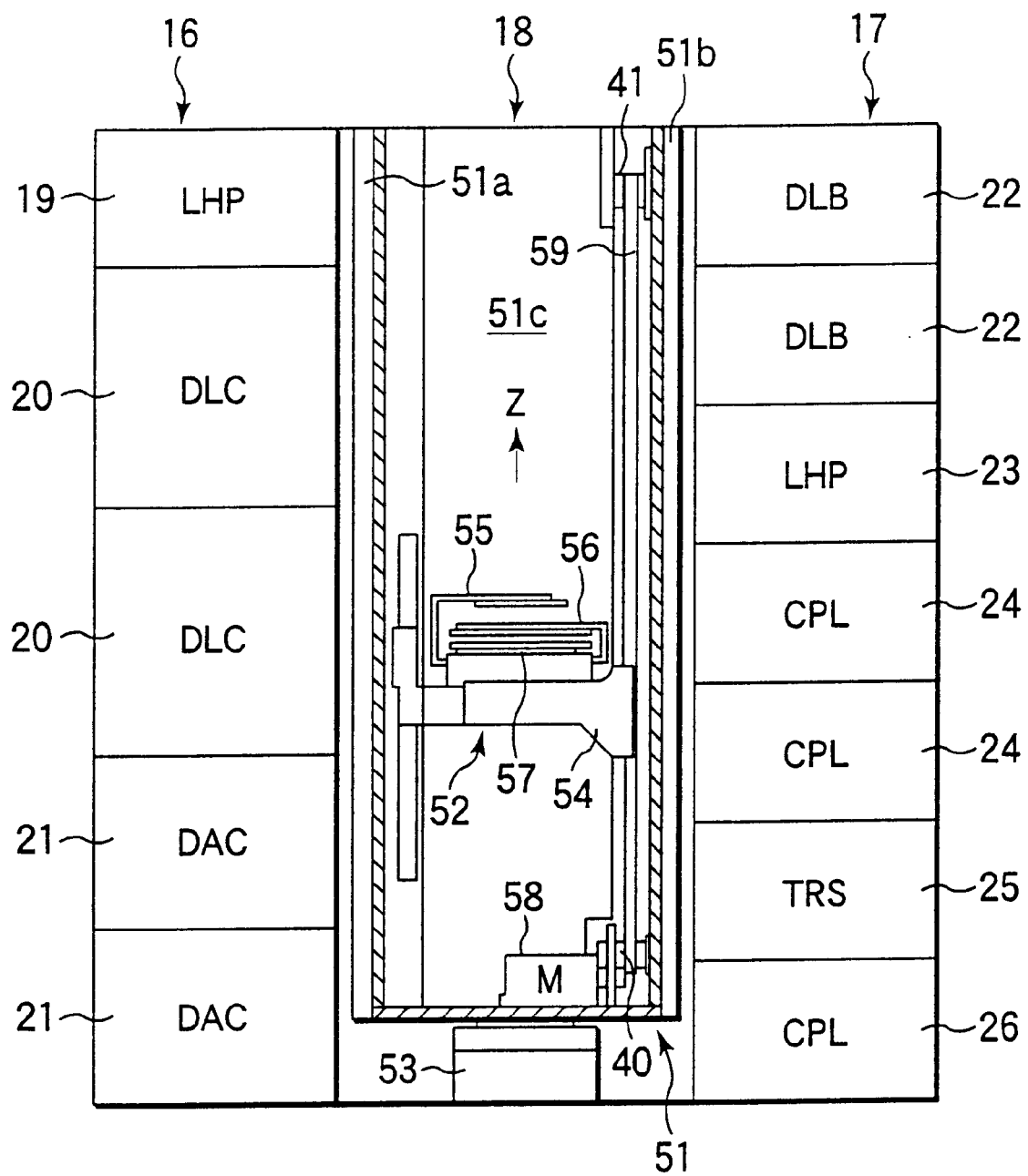
FIG. 3 is a side view showing a group of process units mounted to the SOD system shown in FIG. 1.

FIG. 1 is a plan view showing the SOD system, FIG. 2 is a side view of the SOD system shown in FIG. 1, and FIG. 3 is a side view showing a group of process units mounted in the SOD system shown in FIG. 1.

The SOD system includes mainly a process section 1, a side cabinet 2, and a carrier station (CSB) 3. As shown in FIGS. 1 and 2, coating process units (SCT) 11, 12 are arranged in an upper portion on the front side of the process section 1. Also, chemical units 13, 14 are arranged below the coating process units (SCT) 11, 12, respectively.

As shown in FIGS. 1 and 3, process unit groups 16, 17 each consisting of a plurality of process units stacked one upon the other are arranged in the central portion of the process section 1, and a wafer transfer mechanism (PRA) for transferring a semiconductor wafer (wafer) W is arranged vertically movable between these process unit groups 16 and 17.

The wafer transfer mechanism (PRA) 18 includes a cylindrical support body 51 extending in a Z-direction and having vertical walls 51a, 51b and a side surface open portion 51c positioned between these vertical walls 51a and 51b, and a wafer transfer body 52 arranged inside the cylindrical support body 51 and vertically movable in the Z-direction along the cylindrical support body 51. The cylindrical support body 51 can be rotated by the rotary driving force produced by a motor 53. In accordance with rotation of the cylindrical support body 51, the wafer transfer body 52 is also rotated integrally with the cylindrical support body 51.

The wafer transfer body 52 includes a transfer base 54, and three wafer transfer arms 55, 56, 57 movable back and forth along the transfer base 54. The wafer transfer arms 55, 56, 57 are sized so as to be capable of passing through the side surface open portion 51c of the cylindrical support body 51. These wafer transfer arms 55, 56, 57 can be independently moved back and forth by a motor and a belt mechanism arranged within the transfer base 54. The wafer transfer body 52 can be moved in the vertical direction by driving a belt 59 by a motor 58. Incidentally, reference numeral 40 shown in FIG. 3 denotes a driving pulley, and reference numeral 41 denotes a driven pulley.

As shown in FIG. 3, the process unit group 16 on the left side comprises a hot plat unit (LHP) for a low temperature, two DLC units 20, and two aging units (DAC) 21, which are stacked one upon the other as viewed from the upper side.

On the other hand, the process unit group 17 on the right side includes two DLB units 22, a hot plate unit (LHP) 23 for a low temperature, two cooling plate units (CPL) 24, a delivery unit (TRS) 25, and a cooling plate unit (CPL) 26, which are stacked one upon the other as viewed from the upper side. Incidentally, the delivery unit (TRS) 25 also can functions as the cooling plate unit.

The side cabinet 2 as shown in FIG. 1 includes a bubbler (Bub) 27 for supplying a chemical solution and a trap (TRAP) 28 for washing the exhaust gas. Also, a power supply source (not shown), a chemical solution chamber (not shown) for storing a chemical solution such as hexamethyl disilane (HDMS) and a gas such as an ammonia gas ($NH_3$), and a drain for discharging the waste process solution used in the SOD system are arranged below the bubbler (Bub) 27.

When an interlayer insulating film or the like is formed on a wafer W by means of, for example, a sol-gel method by using the SOD system described above, the wafer W is transferred through the cooling plate units (CPL) 24, 26, the coating process units (SCT) 11, 12, the aging unit (DAC) 21, the hot plate units (LHP) 19, 23 for a low temperature, and the DLB unit 22, in that order for applying predetermined treatments to the wafer W.

Further, when an interlayer insulating film or the like is formed on the wafer W by means of the silk method and the speed film method, the wafer W is transferred through the cooling plate units (CPL) 24, 26, the coating process units (SCT) 11, 12 (for coating the adhesion promoter), the hot plate units (LHP) 19, 23 for a low temperature, the coating process units (SCT) 11, 12 (for coating the chemical solution for forming the film), the hot plate units (LHP) 19, 23 for a low temperature, the DLB unit 22, and the DLC unit 20, in that order mentioned for applying predetermined treatments to the wafer W.

Further, where an interlayer insulating film or the like is formed on the wafer W by the FOX method, the wafer W is transferred through the cooling plate units (CPL) 24, 26, the-coating process units (SCT) 11, 12, the hot plate units (LHP) 19, 23 for a low temperature, the DLB unit 22 and the DLC unit 20, in that order mentioned for applying the predetermined treatments to the wafer W.

Incidentally, the material of the interlayer insulating film or the like formed by these various methods is not particularly limited. It is possible to use various organic, inorganic and hybrid materials.

Figure 4:
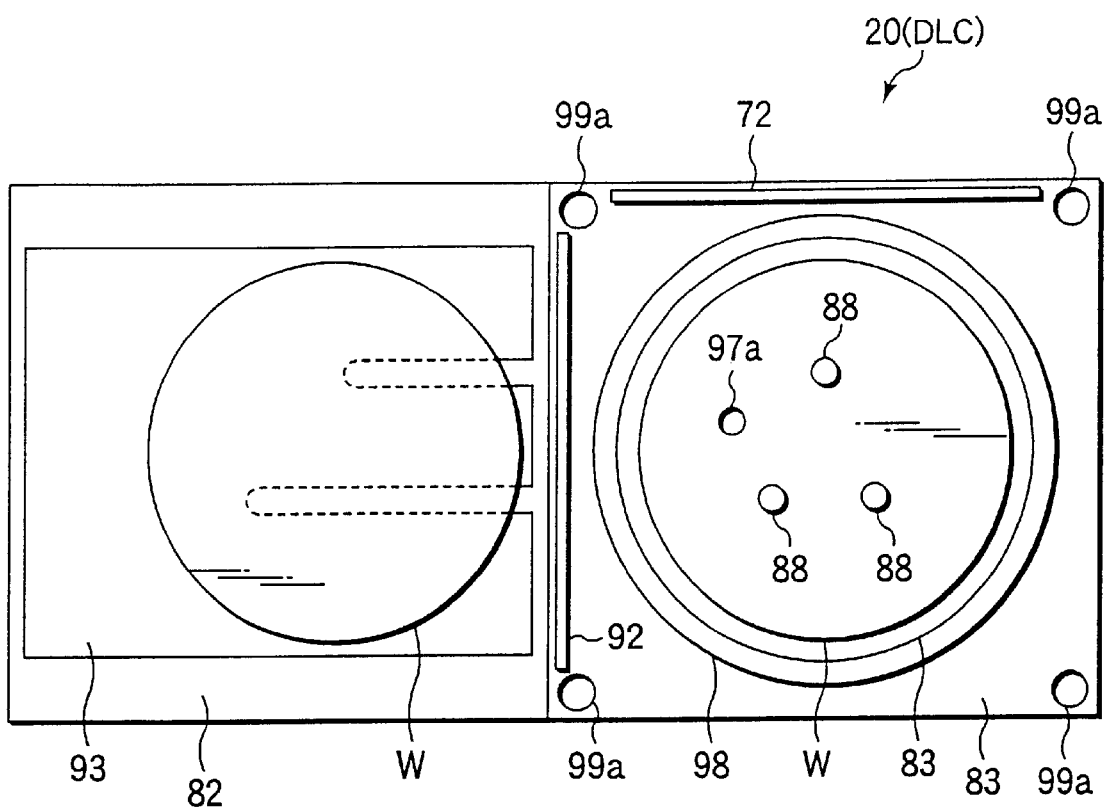
FIG. 4 is a plan view schematically showing the structure of the DLC unit.
Figure 5:
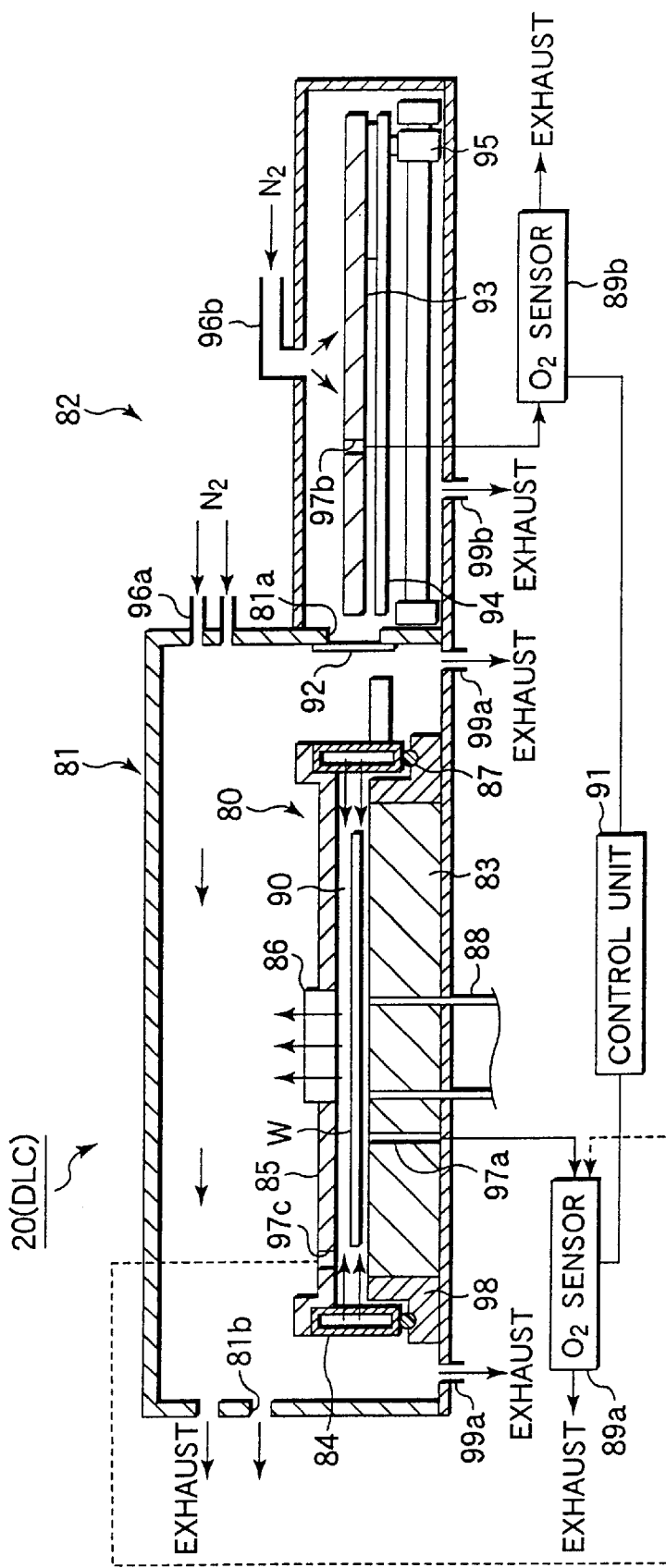
FIG. 5 is a cross sectional view schematically showing the structure of the DLC unit.

The structure of each of the DLC unit 20 and the DLB unit 22 will now be described in detail. FIG. 4 is a plan view schematically showing the structure of the DLC unit 20, and FIG. 5 is a cross sectional view showing the processing state of the wafer W in the DLC unit 20.

The DLC unit 20 includes a heating process chamber 81 and a cooling process chamber 82 arranged contiguous to the heating process chamber 81. A shutter 92 is arranged between the heating process chamber 81 and the cooling process chamber 82. The shutter 92 is opened or closed for the delivery of the wafer W between the heating process chamber 81 and the cooling process chamber 82. Also, a shutter 72 is arranged within the heating process chamber 81. The shutter 72 is opened or closed for the delivery of the wafer W between the heating process chamber 81 and the wafer transfer mechanism (PRA) 18.

A hot plate 83 capable of setting the temperature at 200° C. to 470° C. is arranged within the heating process chamber 81. A support ring 98 is arranged to surround the outer circumferential surface of the hot plate 83. A stepped portion is formed in the support ring 98, and a seal ring 87 is formed in the lower stage of the support ring 98. Support pins (not shown) are mounted in a plurality of positions on the upper surface of the hot plate 83. The wafer W is supported by these support pins such that the wafer W is disposed on the hot plate 83 a predetermined distance apart from the upper surface of the hot plate 83.

Three lift pins 88 (only two lift pins 88 being shown in FIG. 5) for vertically moving the wafer W in response to the operation of a lift mechanism (not shown) are arranged to extend through the hot plate 83. These lift pins 88 serve to support the wafer W at a predetermined height during delivery of the wafer W and are held at the positions at which, for example, the tips of the support pins 88 are flush with the upper surface of the hot plate 83 during the heat treatment.

There is formed a gas collecting port 97a for collecting from the upper surface of the hot plate 83 the atmosphere gas within the heating process chamber 81 or a process space 90 referred to hereinbelow in the portion of the hot plate 83 which faces the lower surface of the wafer W when the wafer W is disposed on the hot plate 83. In order to allow the atmosphere gas within the heating process chamber 81 or the process space 90 to flow from the gas collecting port 97a into an oxygen ($O_2$) sensor 89a, an exhaust mechanism (not shown) is arranged downstream of the oxygen sensor 89a.

As described above, the gas collecting port 97a for collecting the atmosphere gas within the process space 90 is formed below the wafer W. Alternatively, it is also possible to form a gas collecting port 97c in a lid 85 positioned above the wafer W.

A chamber 80 that can be moved in the vertical direction by a lift mechanism (not shown) is arranged above the hot plate 83. The chamber 80 includes the lid 85 having an exhaust mechanism 86 formed in the central portion and a gas purge ring 84 surrounding the outer circumferential surface of the lid 85. When the chamber 80 is in the process position shown in FIG. 5, the lower surface of the gas purge ring 84 abuts against the seal ring 87 so as to define the process space 90.

An inert gas such as a nitrogen gas ($N_2$) supplied from a gas supply source (not shown) is spurted out from the inner circumferential surface of the gas purge ring 84 toward the central portion of the process space 90. The spurting of the inert gas from the gas purge ring 84 is started after, for example, the wafer W is transferred into the DLC unit 20 and is continued until the wafer W is taken out of the system after completion of the curing treatment.

As shown in FIG. 5, under the state that the process space 90 is formed, the inert gas is spurted onto both the front side and back side of the wafer W disposed on the hot plate 83 so as to make it possible to maintain uniform and low concentration of oxygen in the atmosphere in the vicinity of the front surface and the back surface of the wafer W. When the wafer W is heated within the heating process chamber 81, various substances are evaporated and sublimed from the coated film formed on the wafer W. These gaseous materials are exhausted through the exhaust mechanism 86 together with the inert gas supplied from the gas purge ring 84.

When an inert gas is supplied into the process space 90 having a small inner volume, it is possible to maintain the atmosphere within the process space 90 having the wafer W disposed therein at a low oxygen concentration without fail with an amount of the inert gas supply smaller than in the case wherein the inert gas is supplied into the entire heating process chamber 81, thereby lowering the running cost.

It is possible to supply an inert gas such as a nitrogen gas into the heating process chamber 81 through a gas supply pipe 96a so as to make it possible to maintain the atmosphere within the heating process chamber 81 at a predetermined low oxygen concentration. The inert gas supplied into the heating process chamber 81 is exhausted through an exhaust port 81b formed in the side wall and exhaust ports 99a formed in the four corner portions on the bottom wall. The outer air flowing into the heating process chamber 81 when the shutter 72 is opened tends to be accumulated in the corner portions of the heating process chamber 81. In the present invention, however, the atmosphere within the heating process chamber 81 is exhausted through the exhaust ports 99a so as to prevent the outer air from being accumulated in the corner portions of the heating process chamber 81, with the result that a uniform inert gas atmosphere is maintained over the entire region of the heating process chamber 81.

An exhaust passageway is formed to permit the gas exhausted from the exhaust mechanism 86 to be discharged through another route (not shown). It should be noted in this connection that the substances evaporated and sublimed from the coated film formed on the wafer W are contained in the gas exhausted during the heat treatment. The particular exhaust passageway noted above is intended to prevent the heating process chamber 81 from being contaminated by the particular evaporated and sublimed substances.

A communication port 81a that can be opened and closed by a shutter 92 is arranged between the heating process chamber 81 and a cooling process chamber 82. A cooling plate 93 for supporting and cooling the wafer W is arranged within the cooling process chamber 82. The cooling plate 93 can be moved in a horizontal direction by a moving mechanism 95 along a guide rail 94. It is possible for the cooling plate 93 to be moved into the heating process chamber 81 through the communication port 81a so as to receive the wafer W after the heating by the hot plate 83 within the heating process chamber 81 from the lift pins 88. The wafer W received by the cooling plate 93 is transferred into the cooling process chamber 82 so as to be cooled and is brought back on the lift pins 88. The temperature within the cooling plate 93 is set at, for example, 15° C. to 25° C.

A gas collecting port 97b for collecting from the upper surface of the cooling plate 93 the atmosphere gas within the heating process chamber 81 or the cooling process chamber 82 is formed in the portion of the cooling plate 93 which is positioned below the wafer W when the wafer W is disposed on the cooling plate 93. In order to allow the atmosphere gas within the cooling process chamber 82 to flow from the gas collecting port 97b into an oxygen ($O_2$) sensor 89b, an exhaust mechanism (not shown) is arranged downstream of the oxygen sensor 89b. The atmosphere gas exhausted from the gas collecting port 97b is subjected to the oxygen concentration measurement by the oxygen sensor 89b and, then, is discharged from the oxygen sensor 89b.

As described above, the gas collecting ports 97a and 97b are formed in the hot plate 83 and the cooling plate 93, respectively, included in the DLC unit 20 so as to make it possible to measure the oxygen concentration. Therefore, it is possible to collect the atmosphere gas and to measure the oxygen concentration at each position of the wafer W when the wafer W is transferred within the DLC unit 20. In other words, the atmosphere around the wafer W can always be monitored.

An inert gas such as a nitrogen gas can be supplied into the cooling process chamber 82 by using a gas supply pipe 96b so as to maintain the atmosphere within the cooling process chamber 82 at a low oxygen concentration. The inert gas supplied into the cooling process chamber 82 is discharged through an exhaust port 99b formed in the bottom wall.

Figure 6A:
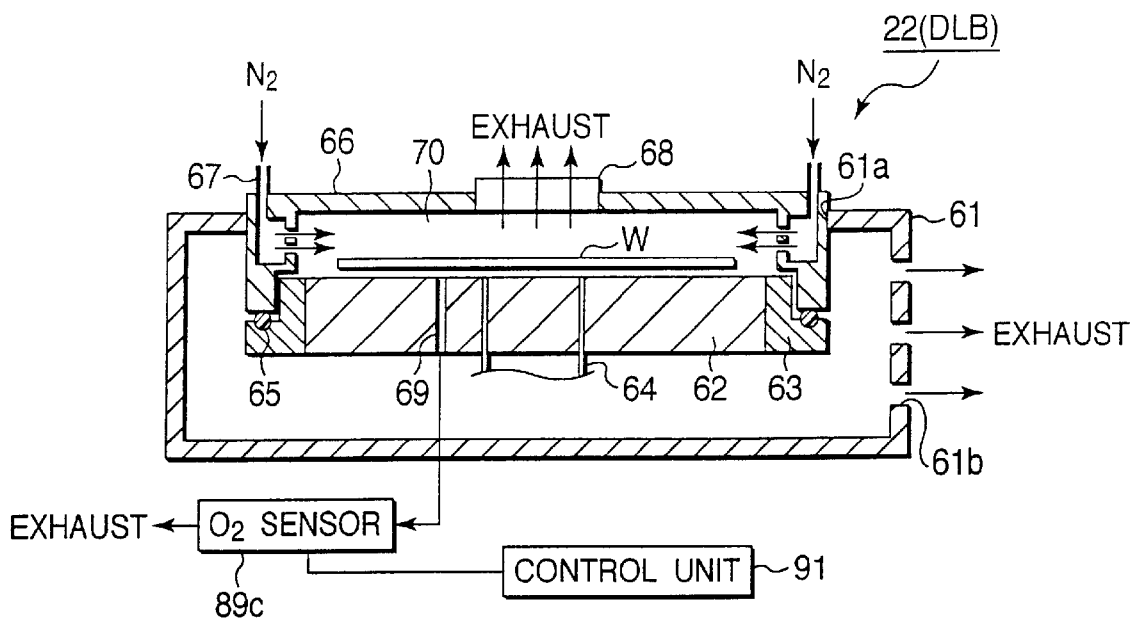
FIG. 6A is a cross sectional view schematically showing the structure of the DLB unit.
Figure 6B:
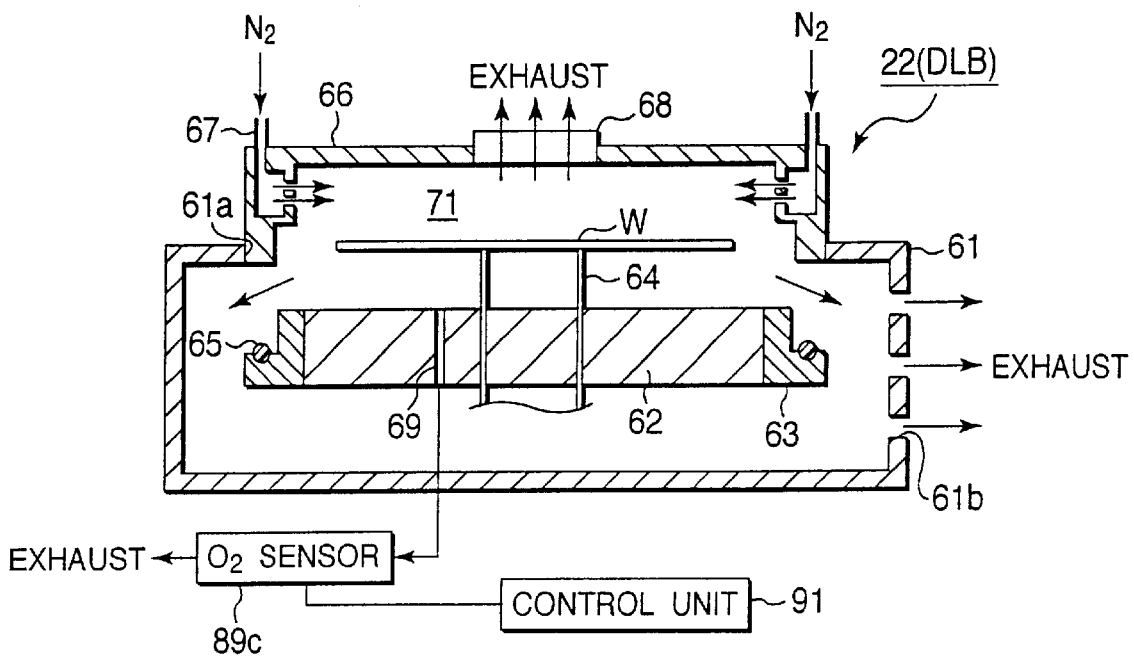
FIG. 6B is another cross sectional view schematically showing the structure of the DLB unit.

FIGS. 6A and 6B are cross sectional views collectively showing schematically the structure of the DLB unit 22. FIG. 6A shows the state during the processing of the wafer W, while FIG. 6B shows the state when the wafer W is delivered.

The DLB unit 22 includes an open portion 61a in the upper surface and an exhaust port 61b in the side surface for exhausting the DLB unit 22. A hot plate 62 capable of setting the temperature at 50° C. to 350° C. is arranged within a casing 61 provided with a shutter (not shown) that can be opened and closed for the delivery of the wafer W between the wafer transfer mechanism (PRA) 18 and the casing 61. A support ring 63 is formed to surround the outer circumferential surface of the hot plate 62. A stepped portion is formed in the support ring 63, and a seal ring 65 is arranged in the lower stage of the stepped portion.

Support pins (not shown) are formed in a plurality of positions on the upper surface of the hot plate 62. The wafer W is supported by these support pins so as to be arranged in a position a predetermined distance apart from the upper surface of the hot plate 83. Three lift pins 64 (only two of the lift pins 64 being shown in FIGS. 6A and 6B), which are driven by a lift mechanism (not shown) so as to move the wafer W in the vertical direction, are formed in a manner to extend through the hot plate 62. When the wafer W is delivered, the lift pins 64 serve to hold the wafer W at a predetermined height, and are positioned during the heat treatment in such a manner that the tips of the lift pins 64 are flush with the upper surface of the hot plate 62.

A lid 66 for opening and closing the open portion 61a is arranged above the hot plate 62. The lid 66 can be moved in the vertical direction by a lift mechanism (not shown). As shown in FIG. 6A, where the lid 66 is in the process position, the lower surface in the peripheral portion of the lid 66 abuts against the seal ring 65 so as to form a process space 70. A gas supply mechanism 67 capable of spurting an inert gas such as a nitrogen gas from the inner circumferential surface is arranged in the peripheral portion of the lid 66.

When the lid 66 is in the elevated position as shown in FIG. 6B, an inert gas is spurted from the gas supply mechanism 67 into the heating process chamber 71 defined by the casing 61 and the lid 66 so as to maintain the oxygen concentration within the heating process chamber 71 at a low level. The inert gas spurted from the gas supply mechanism 67 is discharged through an exhaust mechanism 68 formed in the lid 66 or through the exhaust port 61b formed in the casing 61.

As shown in FIG. 6A, under the state wherein the process space 70 is formed, the inert gas spurted from the gas supply mechanism 67 is discharged through the exhaust mechanism 68 while maintaining the oxygen concentration within the process space 70 at a low level.

The process space 70 has an inner volume smaller than that of the heating process chamber 71. Therefore, the amount of the inert gas supplied into the process space 70 becomes smaller than in the case wherein the inert gas is supplied into the heating process chamber 71. In addition, it is possible to maintain the oxygen concentration in the atmosphere within the process space 70 having the wafer W disposed therein at a low level without fail.

A gas collecting port 69 for collecting the atmosphere gas within the heating process chamber or within the process space 70 from the upper surface of the hot plate 62 is formed in that portion of the hot plate 62 which is positioned below the wafer W when the wafer W is disposed on the hot plate 62. The atmosphere gas collected from the gas collecting port 69 is supplied to an oxygen ($O_2$) sensor 89c so as to be subjected to the oxygen concentration measurement by the oxygen sensor 89c and, then, is discharged through an exhaust mechanism (not shown) arranged downstream of the oxygen sensor 89c. A control unit 91 of the SOD system is connected to the oxygen sensor 89c so as to control the operation of the oxygen sensor 89c.

As described above, the gas collecting port 69 is formed below the wafer W in order to collect the atmosphere gas within the process space 70. Alternatively, it is also possible to form the gas collecting port in the lid 66 positioned above the wafer W.

The oxygen sensors 89a to 89c arranged in the DLC unit 20 and the DLB unit 22 will now be described in detail, with the oxygen sensor 89a arranged in the DLC unit 20 taken up as an example.

A sensor using, for example, zirconia, which is a good oxygen ion conductor, is suitably used as the oxygen sensor 89a. However, the zirconia oxygen sensor has a disadvantage that it is difficult to measure accurately the oxygen concentration in the case where a gas reacting with oxygen such as a hydrogen gas ($H_2$) or a carbon monoxide gas (CO) is contained in the measuring gas.

As already explained, various gases evaporated or sublimed from the coated film formed on the wafer W are discharged through the exhaust mechanism 86. Therefore, it is difficult to measure accurately the oxygen concentration in the gas exhausted from the exhaust mechanism 86.

However, in view of the gas flow in the process space 90 caused by the supply of the inert gas from the gas purge ring 84, the probability for the evaporated or sublimed substances to flow into the back surface of the wafer W is considered to be very low. Further, the front side and the back side of the wafer W are considered to be put under the same nitrogen gas atmosphere by the supply of the inert gas from the gas purge ring 84.

Under these circumstances, in the DLC unit 20, the gas collecting port 97a is formed below the wafer W when the wafer W is disposed on the hot plate 83 so as to collect the gas for measuring the oxygen concentration from the gas collecting port 97a. As a result, it is possible to measure accurately the oxygen concentration within the process space 90.

Incidentally, under the state that the temperature of the wafer W is not higher than, for example, 200° C., the amount of the substances evaporated or sublimed from the coated film formed on the wafer W is small so as to make it possible to measure the oxygen concentration by using the gas collecting port 97c. It is also possible to supply the gas used for measuring the oxygen concentration to the oxygen sensor 89a through the holes formed in the hot plate 83 for allowing the lift pins 88 to extend therethrough in place of forming the gas collecting port 97a.

The oxygen sensor 89a is connected to the control unit 91 of the SOD system. For example, the measurement of the oxygen concentration within the heating process chamber 81 or the process space 90 is started at the time when the wafer W is transferred into the DLC unit 20 in accordance with the processing recipe stored in the control unit 91.

It is possible to prevent in advance the occurrence of a defective curing treatment, if the system is designed in such a manner that the curing treatment is suspended and an alarm is generated, when, for example, the oxygen concentration within the process space 90 fails to be lower than a predetermined level when the wafer W (or the hot plate 83) has been heated to reach a predetermined temperature.

Further, if the system is designed in such a manner that an alarm is generated, when the oxygen concentration has been increased by some causes under the state that the wafer W is put in a predetermined temperature range so as to cause the wafer W to fail to be processed under the oxygen concentration lower than a predetermined level, it is possible to identify the wafer W subjected to a defective curing treatment. In this case, it is possible to give up the subsequent processing to the particular wafer W. In the case of taking such a measure, it is possible to make uniform the quality of the interlayer insulating film or the like formed on the wafer W. It is also possible to suppress the nonuniformity in the characteristics of the interlayer insulating film or the like among the wafers. Further, it is possible to maintain a high quality of the wafer W after the processing.

The present invention is not limited to the method of measuring the oxygen concentration in accordance with the processing recipe in the SOD system, and it is also desirable to measure the oxygen concentration in the DLC unit 20 by a manual operation. For example, it is possible to measure the oxygen concentration without previous notice or to inspect easily the performance of the apparatus after the maintenance or repair of the DLC unit 20 in the case where the measurement of the oxygen concentration is not incorporated in the processing recipe.

Figure 7A:
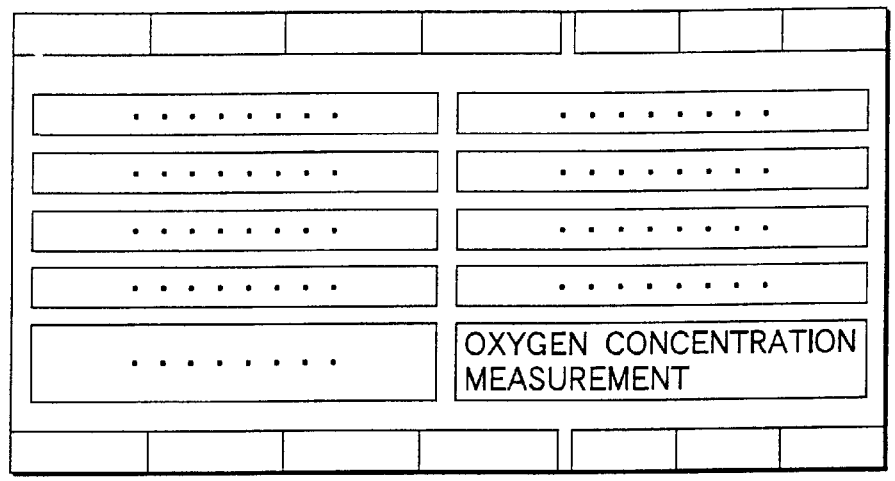
FIG. 7 is for explaining an example of the display of the operation panel in measuring the oxygen concentration by a manual operation.
Figure 7B:
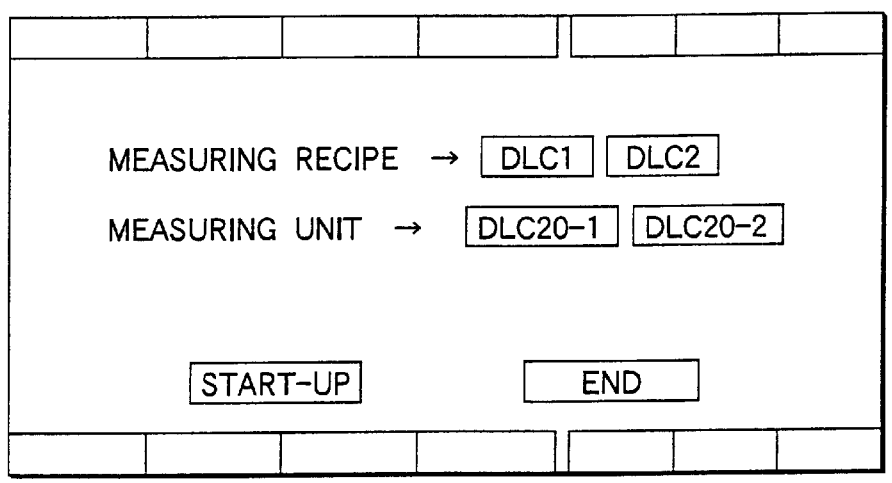
Figure 7C:
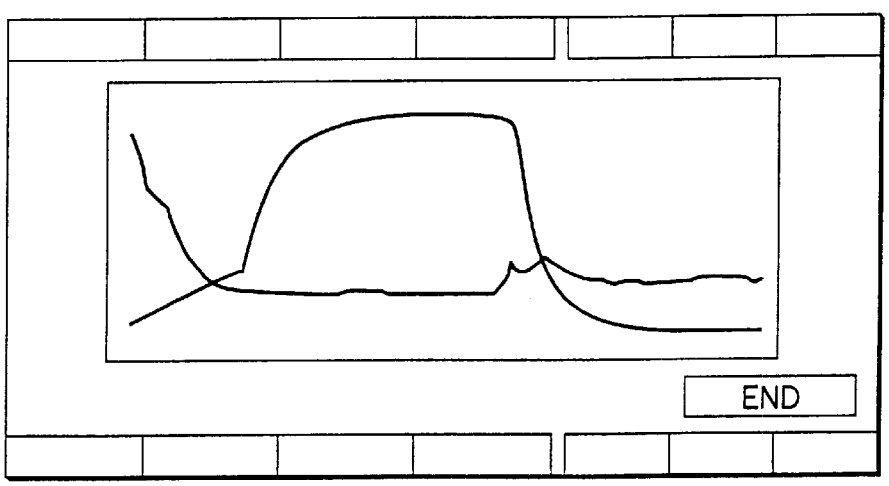

FIGS. 7A, 7B and 7C are illustrations for explaining an example of the display on the operation panel in measuring the oxygen concentration by the manual operation. If the "oxygen concentration measurement" is selected from the main menu as shown in FIG. 7A, then, the name of the unit that is to be measured is displayed on the operation panel as shown in FIG. 7B. If the unit is selected and "start" is selected, the atmosphere is discharged from within the process chamber to the oxygen sensor mounted to the selected unit so as to start the measurement of the oxygen concentration. As a result, the change with time in the oxygen concentration from the start up of the measurement is displayed as shown in FIG. 7C so as to confirm the oxygen concentration in the selected unit.

Incidentally, the system is designed in such a manner that the result of the measurement of the oxygen concentration performed by the oxygen sensor 89a can be displayed on the monitor screen mounted to the control unit 91. When a plurality of DLC units 20 are mounted to a single SOD system as shown in FIG. 3, it is possible to design a system wherein the measurement result of the oxygen concentration in one of the DLC unit 20 can be displayed by the operator's selection. The display of the measurement results in a plurality of DLC units 20 are automatically switched, or the plurality of measurement results can be displayed simultaneously.

The processing operation will now be described, covering the case of forming an interlayer insulating film by the silk method and the speed film method using both the DLC unit 20 and the DLB unit 22.

The wafer W transferred from the carrier station (SCB) 3 into the delivery unit (TRS) 24 is transferred by the wafer transfer mechanism (PRA) 18 into the cooling plate units (CPL) 24, 26 so as to be cooled. It is possible to make uniform the thickness and quality of the coated film by setting constant the temperature of the wafer W before the coating.

In the next step, the wafer W is transferred into the coating process unit (SCT) 11 so as to be coated by the spin coating method with an adhesion promoter used as a first coating solution. The adhesivity of the film is promoted by the coating with the adhesion promoter prior to the coating with a coating solution for forming, for example, the interlayer insulating film. Then, the wafer W is transferred into the cooling plate units (CPL) 24, 26 so as to control the temperature.

The wafer W having the temperature controlled in the cooling plate units (CPL) 24, 26 is then transferred into the coating process unit (SCT) 12 so as to be coated with a second coating solution, i.e., a coating solution for forming an interlayer insulating film. As a result, a coated film is formed on the surface of the wafer W. Then, the wafer W is transferred into the hot plate units (LHP) 19, 23 so as to be subjected to a heat treatment. As a result, the component contained in the coated film, which is evaporated at a relatively low temperature, e.g., water, is removed.

In the next step, the wafer W is subjected to a heat treatment depending on the properties of the solvent contained in the coating solution used for forming the interlayer insulating film and, then, is transferred into the DLC unit 20 so as to be subjected to a curing treatment. Alternatively, the wafer W is transferred directly into the DLC unit 20 so as to be subjected to the curing treatment.

A heat treatment is applied to the wafer W in the DLB unit 22, prior to the curing treatment in the DLC unit 20. The heat treatment in the DLB unit 22 is performed at temperatures higher than the process temperature in the hot plate units (LHP) 19, 23 for a low temperature and at temperatures lower than the process temperature in the subsequent DLC unit 20. In the DLB unit 22, the solvent components and the like contained in the coating solution for forming the interlayer insulating film, which were not yet removed by the heat treatment in the hot plate units (LHP) 19, 23 for a low temperature, are removed by evaporation or sublimation.

It should be noted that the heat treatment unit for heating the wafer W at high temperatures tends to be contaminated with the substance evaporated from the coating solution coated on the wafer W during the heat treatment. Therefore, if the heat treatment of the wafer W is performed at a low temperature by using the heat treatment unit used for performing the heat treatment at high temperatures, the wafer W may be contaminated by the substance contaminating the heat treatment unit. However, it is possible to prevent the wafer contamination, if the heat treatment unit is used suitably depending on the components evaporated or sublimed from the coating solution as described above.

The DLB unit 22 is used for the above-mentioned purpose. However, it is not absolutely necessary to apply the heat treatment using the DLB unit 22. Therefore, the following description covers a case wherein the wafer W coated with a coating solution for forming an interlayer insulating film and subjected to the treatment in the hot plate units (LHP) 19, 23 for a low temperature is transferred directly into the DLC unit 20 so as to receive the curing treatment including the measurement of the oxygen concentration.

Figure 8:
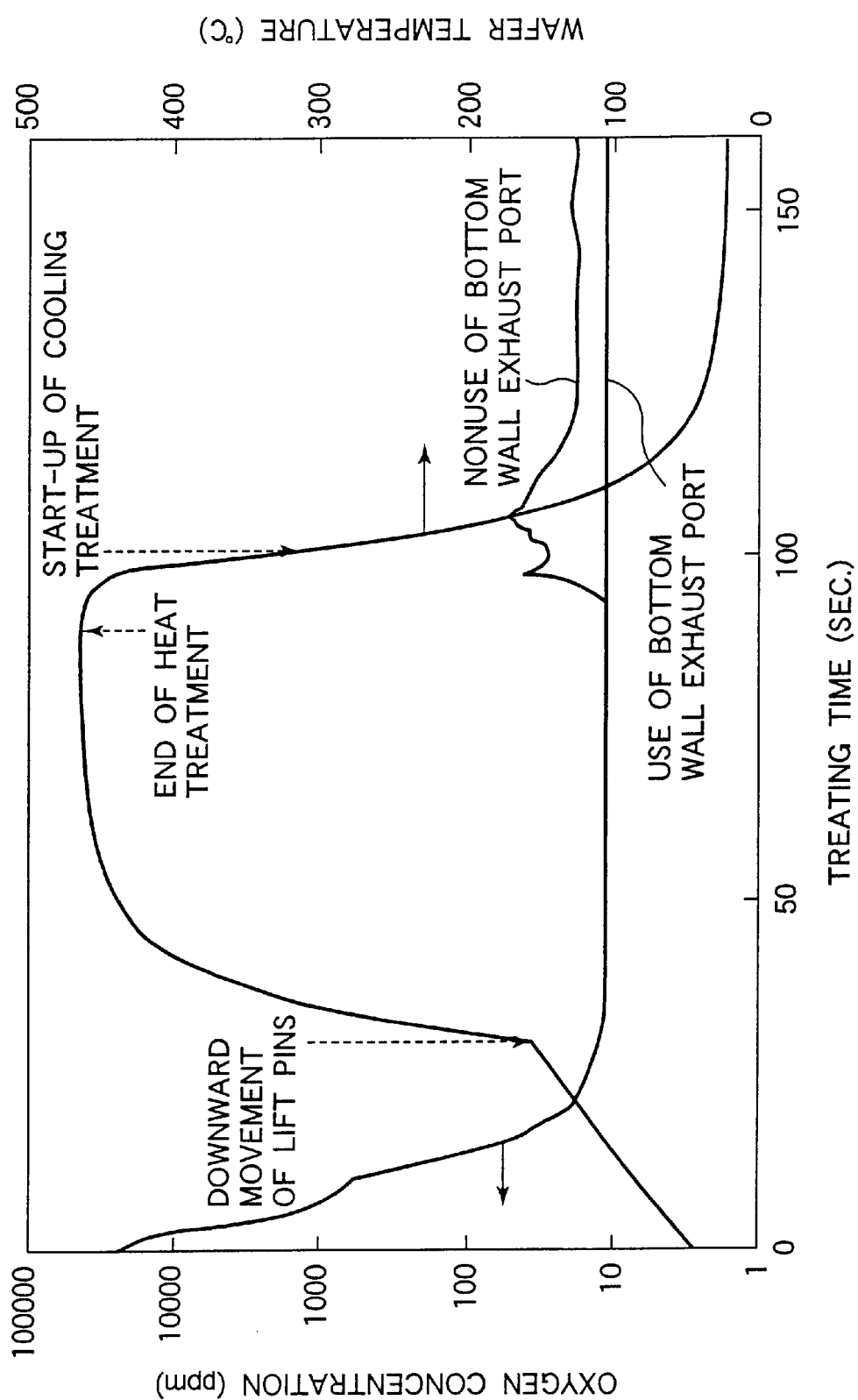
FIG. 8 is a graph showing the change with the processing time in the wafer temperature and the change with the processing time in the oxygen concentration.

FIG. 8 is a chart showing the change with the processing time in the temperature of the wafer W and in the oxygen concentration measured by the oxygen sensors 89a, 89b after the start up of the curing treatment in the DLC unit 20.

Specifically, the shutter 72 mounted to the heating process chamber 81 included in the DLC unit 20 is opened so as to allow the wafer transfer arm holding the wafer W, e.g., the wafer transfer arm 55, to move into the heating process chamber 81. Then, the lift pins 88 are moved upward so as to permit the wafer W to be delivered onto the lift pins 88, followed by retreating the wafer transfer arm 55 from within the heating process chamber 81 and, then, closing the shutter 72.

Figure 9:
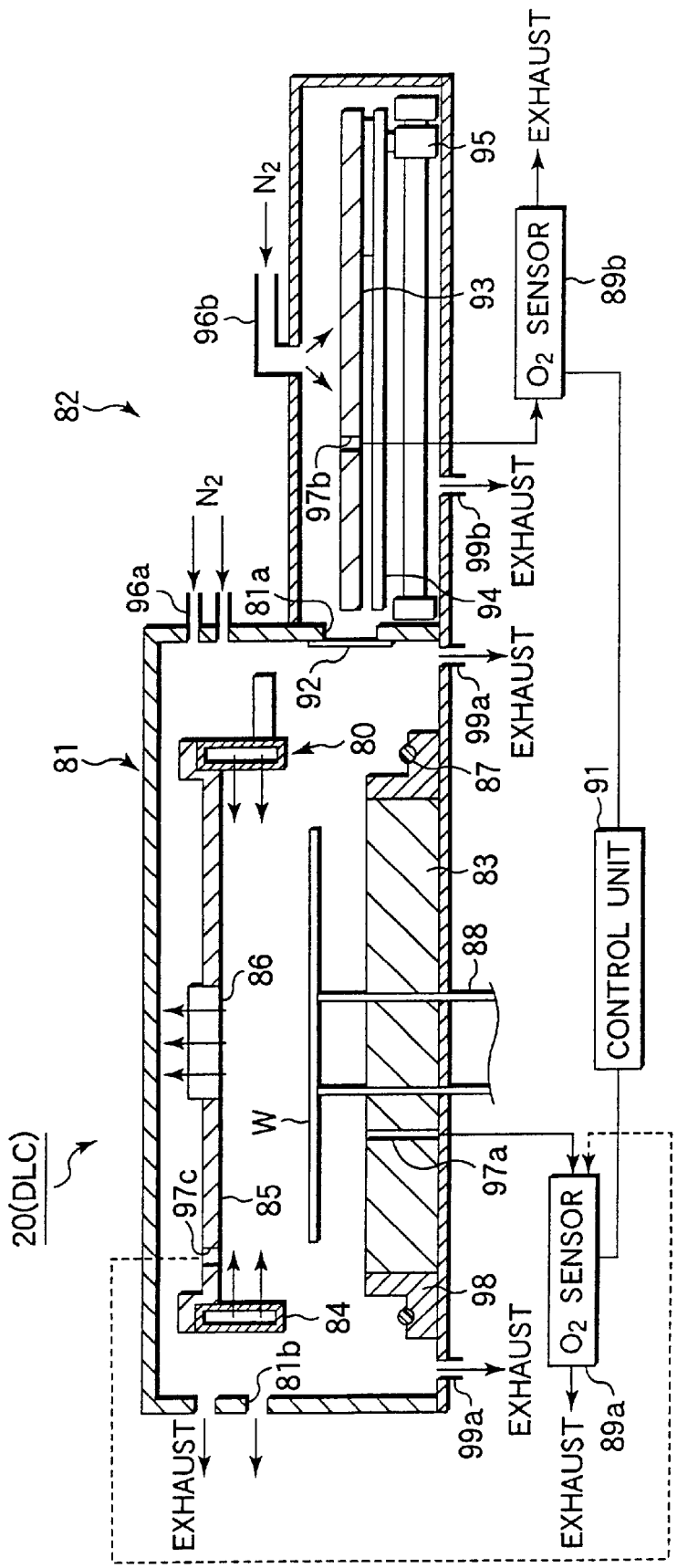
FIG. 9 is another cross sectional view schematically showing the structure of the DLC unit.

As shown in the cross sectional view as shown in FIG. 9, in this step, the chamber 80 is held in the elevated position so as to permit the transfer of the wafer W.

The spurting of a predetermined amount of an inert gas from the gas purge ring 84 and the gas supply pipe 96a is started substantially simultaneously with the delivery of the wafer W from the wafer transfer arm 55 onto the lift pins 88.

It should be noted that, if the exhaust operation through the exhaust ports 99a is started after the shutter 72 is closed, the outer air accumulated in the corner portions of the heating process chamber 81 is released so as to lower the oxygen concentration within the heating process chamber 81.

Further, when the DLC unit 20 is under the state shown in FIG. 9, it is desirable to carry out the exhaust operation only through the exhaust port 81b and the exhaust ports 99a without carrying out the exhaust operation through the exhaust mechanism 86 so as to allow the inert gas spurted from the purge ring 84 to be diffused within the heating process chamber 81, thereby preventing the inert gas spurted from the purge ring 84 from being discharged directly from the exhaust mechanism 86. Thus, a predetermined inert gas atmosphere can be set up promptly within the heating process chamber 81. Further, the gas supply pipe 96a is used preferably for supplying the inert gas.

Figure 10:
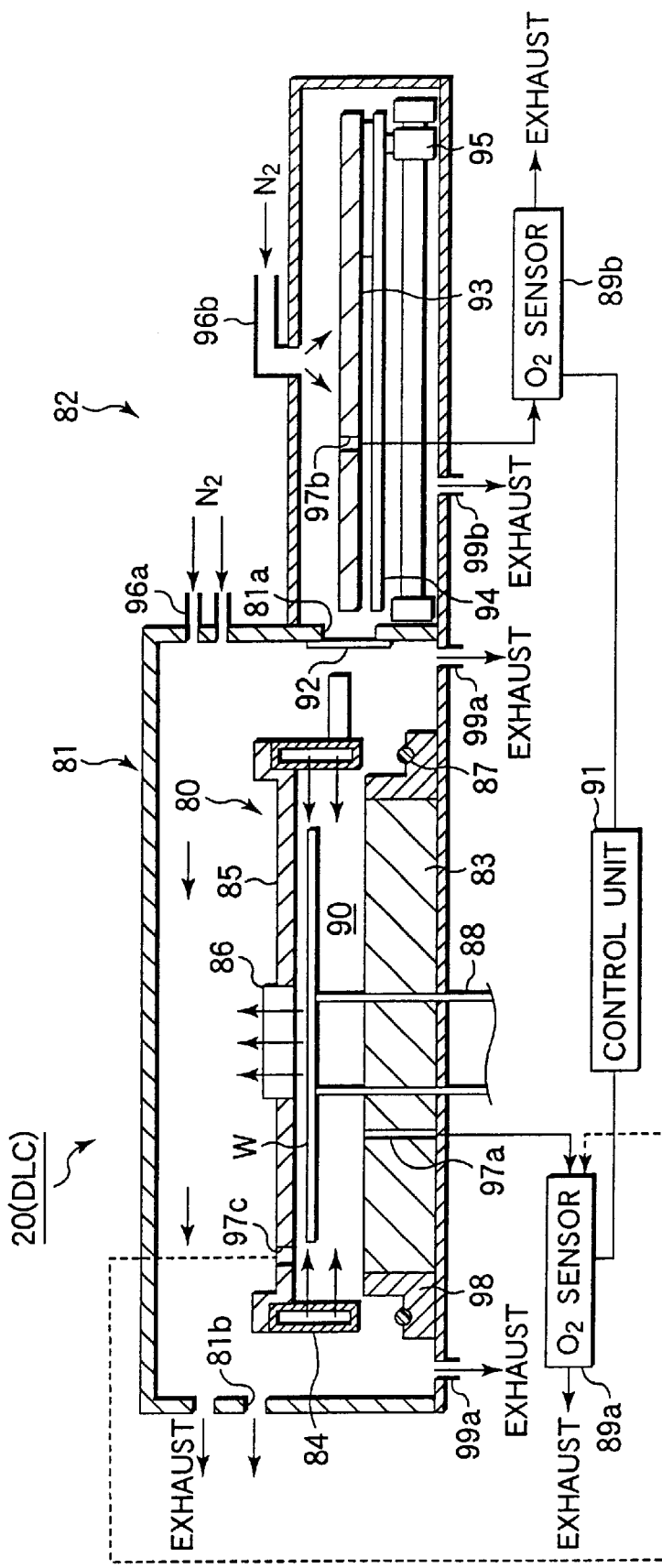
FIG. 10 is still another cross sectional view schematically showing the structure of the DLC unit.

The measurement of the oxygen concentration by the oxygen sensor 89a is started, when the wafer W is held on the lift pins 88 and the shutter 72 is closed. At the same time, the chamber 80 is moved downward to such an intermediate position that the lower surface of the gas purge ring 84 is substantially equal to the upper surface region of the support ring 98, as shown in the cross sectional view given in FIG. 10. Before that particular state is reached, the hot plate 83 is maintained at a predetermined temperature. However, since the upper surface of the hot plate 83 is remote from the wafer W, the temperature elevation of the wafer W is moderate in the initial stage, as shown in FIG. 8. Further, under the state shown in FIG. 10, the process space 90 does not form a hermetic space as shown in FIG. 5. However, oxygen concentration in the process space 90 is rapidly lowered by the spurting of the inert gas from the gas purge ring 84.

In the next step, the lift pins 88 are moved downward. Before the lift pins 88 are moved downward, it is confirmed whether the oxygen concentration in the process space 90 is not higher than a predetermined level. When the oxygen concentration fails to be not higher than a predetermined level, the processing is stopped by generating, for example, an alarm so as to stop the operation of the SOD system and to graspe the situation of the operation in the other process units, thereby preventing the occurrence of the similar defective processing in the subsequent steps, if, for example, the DLC unit 20 is repaired so as to prevent the oxygen concentration from being increased in the DLC unit 20. Incidentally, when the exhaust mechanism 86 is not operated under the state as shown in FIG. 9, the exhaust operation of the exhaust mechanism 86 is started before the lift pins 88 are moved downward.

On the other hand, where the oxygen concentration within the process space 90 is not higher than a predetermined level at the time when the temperature of the wafer W has reached, for example, 150° C., the chamber 80 is also moved downward together with the lift pins 88 so as to permit the wafer W to be held on the support pins formed on the upper surface of the hot plate 83 and to permit the gas purge ring 84 to be in contact with the support ring 98 via the seal ring 87. The particular state is shown in FIG. 5.

Under the state shown in FIG. 5, it is not absolutely necessary to supply the inert gas from the gas supply pipe 96a. As described herein later, in order to suppress the change in the oxygen concentration in the step of transferring the wafer W into the cooling process chamber 82, it is desirable that a predetermined amount of the inert gas is supplied into the heating process chamber 81. When a hermetically closed process space 90 is formed, it is possible to decrease the flow rate spurted from the gas purge ring 84 because the process space 90 has a small inner volume.

As shown in FIG. 8, if the wafer W is held close to the upper surface of the hot plate 83, the temperature of the wafer W is rapidly elevated. As a result, various substances begin to evaporate and sublime from the coated film in accordance with initiation of the curing reaction. These evaporated or sublimed substances do not flow into the region below the wafer W and are discharged through the exhaust mechanism 86. It follows that it is possible to measure the oxygen concentration within the process space 90 during the heat treatment without being affected by the components evaporated from the coated film by collecting the gas for measuring the oxygen concentration from below the wafer W.

It is possible to form an interlayer insulating film having constant properties while preventing the properties from being changed by the oxidation of the formed interlayer insulating film by performing the heat treatment while confirming that the oxygen concentration within the process space 90 is held at a low level when the wafer W is in the state of a high temperature. In other words, it is possible, by detecting on the real time basis the abnormality of the oxygen concentration taking place in the DLC unit 20, to prevent the wafer W from being processed continuously under the abnormal oxygen concentration in the DLC unit 20. Therefore, it is possible to avoid the manufacture of defective articles.

Incidentally, when the oxygen concentration within the process space 90 has been increased to exceed a predetermined level when the wafer is under the state of a high temperature, it is possible to interrupt the processing by generating an alarm. An alarming device generates an alarm such as a voice alarm, a light or the like in automatic response to the measured value of the oxygen sensor 89a. The alarming device may display a predetermined information in the control unit 91.

Further, it is possible to put a predetermined mark to the wafer W during the processing so as to prevent the marked wafer W from being forwarded into the next process step. It is possible to arrange the marking apparatus for putting a mark to the wafer W at a position within the SOD system such that the wafer transfer arms 55, 56, 57 are capable of gaining access to the marking apparatus. In this case, the wafer W is transferred from within the heating process chamber 81 into the marking apparatus so as to put a mark to the wafer W. It is also possible to arrange the marking apparatus within the heating process chamber 81.

While a predetermined heat treatment is being carried out, an inert gas is supplied from the gas supply pipe 96b into the cooling process chamber 82 so as to lower the oxygen concentration within the cooling process chamber 82 to a predetermined low level. After completion of the heat treatment within the heating process chamber 81, the chamber 80 is moved upward and the lift pins 88 are also moved upward so as to hold the wafer W at a position higher than the height at which the cooling plate 93 is introduced into the heating process chamber 81.

In this step, it is desirable to increase the flow rate of the inert gas spurted from the gas purge ring 84 or to increase the gas supply rate from the gas supply pipe 96a under the state that the exhaust ports 99a are opened so as to permit the atmosphere within the heating process chamber 81 to be discharged so as to prevent the oxygen concentration from being increased around the wafer W.

The shutter 92 is operated to open the communication port 81a so as to move the cooling plate 93 into the heating process chamber 81. Then, the lift pins 88 are moved downward so as to permit the wafer W from being delivered from the lift pins 88 onto the cooling plate 93. In accordance with the movement of the wafer W in this step, the measurement of the oxygen concentration using the oxygen sensor 89a is switched over to the measurement of the oxygen concentration using the oxygen sensor 89b, with the result that the oxygen concentration around the wafer W can be measured more accurately and can be monitored.

The oxygen concentration may sometimes increase temporarily as is apparent from the curve of "nonuse of wall exhaust ports in bottom wall" in FIG. 8, when the exhaust operation using the exhaust ports 99a is not performed when the wafer W is transferred from within the heating process chamber 81 into the cooling process chamber 82. The above-mentioned increase in the oxygen concentration may be considered to be caused by the phenomenon that the outer air flowing into the heating process chamber 81, and that the accumulated outer air is caused to flow so as to be diffused around the wafer W when the shutter 92 is opened.

Figure 11:
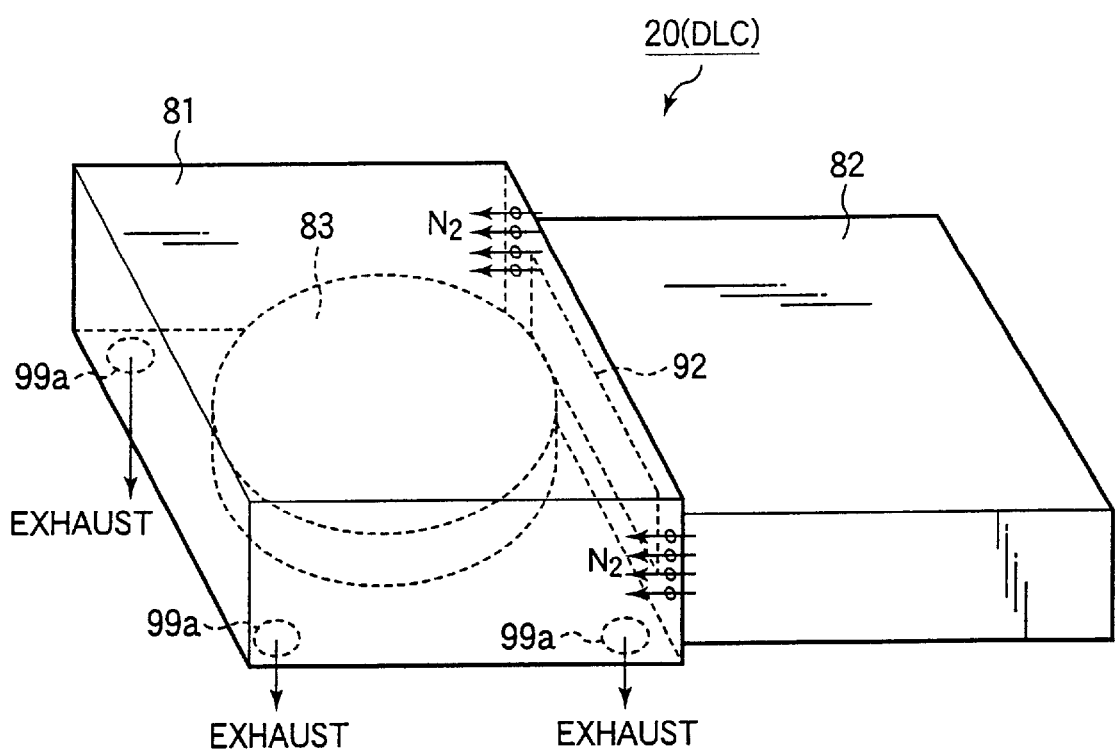
FIG. 11 is a view for explaining the exhaust route from the bottom wall in the DLC unit.

When the wafer W is moved from the hot plate 83 onto the cooling plate 93, the wafer W has a sufficiently high temperature. Under that particular situation, it is undesirable that the wafer W is put under the atmosphere having a high oxygen concentration. However, in the DLC unit 20, it is possible to discharge the air atmosphere accumulated in the corner portions of the heating process chamber 81 to the outside by opening the exhaust ports 99a, as shown in FIG. 11. Thus, it is possible to prevent the oxygen concentration from being increased around the wafer W during the movement of the wafer W, thereby maintaining satisfactory properties of the formed interlayer insulating film, as apparent from the curve of "use of exhaust port in bottom wall", which represents the exhaust operation through the exhaust ports 99a, shown in FIG. 8.

Incidentally, in the case of using a DLC unit in which the exhaust ports 99a are not formed, it is desirable to increase the flow rate of the inert gas supplied into the heating process chamber 81 when the wafer W is transferred from the heating process chamber 81 into the cooling process chamber 82 so as to prevent the oxygen concentration from being increased around the wafer W.

In the next step, the cooling plate 93 holding the wafer W is transferred from the heating process chamber 81 back into the cooling process chamber 82 and, then, the shutter 92 is closed so as to apply a cooling treatment to the wafer W within the cooling process chamber 82. Since the wafer W after completion of the cooling treatment is not heated to a high temperature, it is possible to stop supplying an inert gas into the heating process chamber during the cooling treatment of the wafer W.

After completion of the cooling treatment applied to the wafer W, the inert gas supply from the gas supply pipe 96b is stopped, and the wafer W is once delivered onto the lift pins 88 within the heating process chamber 81. Then, the wafer W is transferred out of the heating process chamber 81 by using the wafer transfer arms 55, 56, 57 of the wafer transfer mechanism (PRA) 18, thereby finishing the curing treatment of the interlayer insulating film within the DLC unit 20. The wafer W held by the wafer transfer arms 55, 56, 57 is brought back onto the carrier station (SCT) 3 through the delivery unit (TRS) 25.

Incidentally, the measurement of the oxygen concentration in the case of using the DLB unit 22 is performed as in the case of using the DLC unit 20. To be more specific, since the wafer W is heated to a relatively high temperature in the DLB unit 22, the characteristics of the interlayer insulating film formed by oxidizing the coated film tend to be changed, if an oxygen is contained in a high concentration in the treating atmosphere.

Such being the situation, the DLB unit 22 is designed to supply an inert gas into the heating process chamber 71 and the process space 70. Further, the oxygen sensor 89c is mounted as shown in FIGS. 6A and 6B so as to detect whether the oxygen concentration in the heating process chamber 71 and the process space 70 during the treatment is not higher than a predetermined level.

The heat treatment within the DLB unit 22 is carried out, for example, as follows. Specifically, the wafer W is transferred first into the heating process chamber 71 by using the wafer transfer arm 55 (or 56, 57) under the state that an inert gas is supplied from the gas supply mechanism 67 into the heating process chamber 71, and the measurement of the oxygen concentration by the oxygen sensor 89c is started at the time when the wafer W was delivered onto the lift pins 64. Then, the lift pins 64 are moved downward so as to allow the wafer W to be supported by the support pins of the hot plate 62. Further, the lid 66 is moved downward so as to form the process space 70. After formation of the process space 70, the flow rate of the inert gas from the gas supply mechanism 67 into the process space 70 is decreased.

After completion of the predetermined heat treatment, the supply amount of the inert gas from the gas supply mechanism 67 is increased, and the lid 66 and the lift pins 64 are moved upward. Then, the wafer transfer arm 55 (or 56, 57) is moved into the heating process chamber 71 so as to allow the wafer W to be delivered onto the wafer transfer arm 55 (or 56, 57). The wafer W is then transferred into the cooling plates (CPL) 24, 26 so as to be once cooled and, then, further transferred into the DLC unit 20 so as to be subjected to a curing treatment of the coated film.

Where the oxygen concentration within the heating process chamber or the process space 70 is higher than a predetermined value in spite of the situation that the wafer W is heated to a predetermined high temperature by a series of heat treatments applied in the DLB unit 22, it is possible to take appropriate measures such as an interruption of the heat treatment.

In each of the embodiments described above, the heat treatment apparatus of the present invention is applied to the DLC unit 20 and the DLB unit 22 of the SOD system for forming an interlayer insulating film. However, the present invention is not limited to these embodiments. For example, the technical idea of the present invention may also be applied to a heat treatment apparatus of a coated film-forming system for forming a resist film or a protective film. Further, the present invention may be applied to a heat treatment apparatus in general, wherein it is desirable to control the oxygen concentration and the other components affecting the detection sensitivity of the oxygen sensor are generated by the heat treatment.

Further, each of the DLC unit 20 and the DLB unit 22 included in the embodiments of the present invention described above a so-called "one by one type unit", in which a single wafer W is processed in a single operation. However, it is also possible to apply the technical idea of the present invention to the treatment apparatus in which a plurality of wafers W are simultaneously subjected to a heat treatment. Further, the substrate precessed in the present invention is not limited to a semiconductor wafer. It is also possible to process other substrates such as an LCD substrate by the apparatus and method of the present invention.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A heat treatment apparatus for applying a predetermined heat treatment to a substrate having a coated film formed thereon, comprising:

a hot plate on which the substrate is disposed;

a chamber for housing the substrate disposed on said hot plate; and an oxygen concentration measuring device for measuring the oxygen concentration within said chamber;

wherein the oxygen concentration is measurable by said oxygen concentration measuring device while a heat treatment is being applied to said substrate;

a signal input-control device for executing measurement of the oxygen concentration by said oxygen concentration measuring device under one of an automatic control and a manual operation; and a monitor for displaying a result of measurement of the oxygen concentration by said oxygen concentration measuring device under said one of said automatic control and said manual operation.

2. The heat treatment apparatus according to claim 1, wherein said substrate comprises a semiconductor wafer, and said coated film comprises an interlayer insulating film.

3. A heat treatment apparatus for applying a predetermined heat treatment to a substrate having a coated film formed thereon, comprising:
- a hot plate on which the substrate is disposed;
- a chamber for housing the substrate disposed on said hot plate; and
- an oxygen concentration measuring device for measuring the oxygen concentration within said chamber;
- wherein the oxygen concentration is measurable by said oxygen concentration measuring device while a heat treatment is being applied to said substrate;
- a signal input-control device for executing measurement of the oxygen concentration by said oxygen concentration measuring device under one of an automatic control and a manual operation;
- a monitor for displaying a result of measurement of the oxygen concentration by said oxygen concentration measuring device under said one of said automatic control and said manual operation;
- and at least one of an alarm for generating an alarm when the measured value of the oxygen concentration measured by said oxygen concentration measuring device has exceeded a predetermined value; and a marking device for putting a mark on the substrate subjected to a heat treatment under a state wherein the measured value of the oxygen concentration measured by said oxygen concentration measuring means has exceeded a predetermined level.

4. The heat treatment apparatus according to claim 1, wherein said oxygen concentration measuring device comprises an oxygen sensor using zirconia.

5. A heat treatment apparatus for applying a predetermined heat treatment to a substrate having a coated film formed thereon, comprising:
- a hot plate for supporting said substrate a predetermined distance apart from the surface thereof;
- a chamber for housing said substrate supported by said hot plate;
- a gas collecting port for collecting the gas within the chamber, said gas collecting port being formed in said hot plate at a position facing the lower surface of the substrate when the substrate is disposed on said hot plate; and
- an oxygen concentration measuring device for measuring the oxygen concentration in the gas collected from said gas collecting port;
- wherein the oxygen concentration is measurable by said oxygen gas measuring means while a heat treatment is being applied to the substrate.

6. The heat treatment apparatus according to claim 5, wherein said substrate comprises a semiconductor wafer, and said coated film comprises an interlayer insulating film.

7. The heat treatment apparatus according to claim 5, further comprising:
- a signal input-control device for measuring the oxygen concentration by said oxygen concentration measuring device under an automatic control or by a manual operation; and
- a monitor for displaying the result of measurement of the oxygen concentration by said oxygen concentration measuring device under an automatic control or by a manual operation.

8. The heat treatment apparatus according to claim 5, further comprising:
- a gas supply for supplying an inert gas into said chamber; and
- an exhaust for exhausting said chamber from an upper portion of said chamber.

9. The heat treatment apparatus according to claim 8, wherein said gas supply supplies an inert gas onto an upper side and a lower side of the substrate disposed on said hot plate.

10. The heat treatment apparatus according to claim 5, wherein said oxygen concentration measuring means comprises an oxygen sensor using zirconia.

11. A heat treatment apparatus, which includes a heating process chamber and a cooling process chamber, for applying a predetermined thermal treatment to a substrate having a coated film formed thereon,
said heating process chamber comprising:
- a hot plate for supporting a substrate a predetermined distance apart from the surface thereof;
- a housing chamber for housing the substrate supported by said hot plate;
- a gas supply for supplying an inert gas into said chamber;
- an exhaust device for exhausting said chamber from an upper portion of the chamber;
- a first gas collecting port for collecting the gas from within said heating process chamber or from within said housing chamber, said first gas collecting port being formed in the hot plate at a position facing the lower surface of the substrate when the substrate is disposed on the hot plate; and
- a first oxygen concentration measuring device for measuring the oxygen concentration in the gas collected from said first gas collecting port; and said cooling process chamber comprising:
- a cooling plate for supporting the substrate a predetermined distance apart from the surface thereof;
- a second gas collecting port for collecting the gas from within said cooling process chamber, said second gas collecting port being formed in said cooling plate at a position facing the lower surface of said substrate when said substrate is disposed on said cooling plate; and
- a second oxygen concentration measuring device for measuring the oxygen concentration in the gas collected from said second gas collecting port;
- wherein the oxygen concentration is measurable by said first oxygen concentration measuring device and said second oxygen concentration measuring device while a heat treatment is being applied to said substrate.

12. The heat treatment apparatus according to claim 11, wherein said substrate comprises a semiconductor wafer, and said coated film comprises an interlayer insulating film.

13. The heat treatment apparatus according to claim 11, which comprises a switching device for switching over the measurement of the oxygen concentration by said first oxygen concentration measuring device to and from said second oxygen concentration measuring device in accordance with movement of said substrate upon transferring of said substrate between said hot plate and said cooling plate.

14. The heat treatment apparatus according to claim 11, further comprising:
- a signal input-control device for measuring the oxygen concentration by said oxygen concentration measuring means under one of an automatic control and a manual operation; and
- a monitor for displaying the result of measurement of the oxygen concentration by said oxygen concentration measuring device under said one of said an automatic control and said manual operation.

15. The heat treatment apparatus according to claim 11, further comprising:

at least one of an alarm for generating an alarm when the oxygen concentration measured by said oxygen concentration measuring device has exceeded a predetermined value; and a marking device for putting a mark on said substrate subjected to a heat treatment under the state that the oxygen concentration measured by said oxygen concentration measuring device has exceeded a predetermined level.

16. The heat treatment apparatus according to claim 11, wherein said oxygen concentration measuring device comprises an oxygen sensor using zirconia.

17. A heat treatment method for applying a predetermined heat treatment to a substrate having a coated film formed thereon, comprising:

positioning said substrate on a thermal processing plate;

collecting a predetermined gas from below said substrate disposed on said thermal processing plate for measuring the oxygen concentration of said predetermined gas; and holding said substrate for a predetermined time while measuring said oxygen concentration.

18. The heat treatment method according to claim 17, wherein said coated film comprises an interlayer insulating film, and said substrate comprises a semiconductor wafer.

19. A heat treatment method for applying a predetermined heat treatment to a substrate having a coated film formed thereon, comprising:

holding said substrate in a predetermined position above a thermal processing plate and supplying an inert gas toward said substrate;

collecting a predetermined gas from a position on the upper surface of said thermal processing plate and facing the lower surface of said substrate when the substrate is disposed on said thermal processing plate for measuring the oxygen concentration in said gas;

positioning the substrate close to said thermal processing plate and holding the substrate for a predetermined time while measuring said oxygen concentration; and taking out said substrate held for the predetermined time on the thermal processing plate so as to stop the measurement of the oxygen concentration.

20. The heat treatment method according to claim 19, wherein said coated film comprises an interlayer insulating film, and said substrate comprises a semiconductor wafer.

21. A heat treatment apparatus for applying a predetermined heat treatment to a substrate having a coated film formed thereon, comprising:

a heat treatment chamber including a thermal processing plate for supporting said substrate a predetermined distance apart from the surface thereof and a chamber for housing the substrate supported by said thermal processing plate; and an exhaust mechanism for exhausting said heat treatment chamber from a corner portion on the bottom side;

a gas collecting port formed in said thermal processing plate in a position facing the lower surface of said substrate when said substrate is disposed on said thermal processing plate for collecting a gas from within said heat treatment chamber;

an oxygen concentration measuring device for measuring the oxygen concentration of the gas collected from said gas collecting port while the substrate is being subjected to a heat treatment; and a gas supply device for supplying an inert gas into said heat treatment chamber.

22. The heat treatment apparatus according to claim 5, further comprising:

an alarm for generating an alarm when the oxygen concentration measured by said oxygen concentration measuring device has exceeded a predetermined value; and/or a marking device for putting a mark on the substrate subjected to a heat treatment under the state that the oxygen concentration measured by said oxygen concentration measuring device has exceeded a predetermined level.

* * * * *